United States Patent [19]

Gorzel

[11] Patent Number: 4,721,962
[45] Date of Patent: Jan. 26, 1988

[54] ANTENNA FOR A TRANSCEIVER, PARTICULARLY PORTABLE TELEPHONE

[75] Inventor: Heribert Gorzel, Berlin, Fed. Rep. of Germany

[73] Assignee: Robert Bosch GmbH, Stuttgart, Fed. Rep. of Germany

[21] Appl. No.: 868,150

[22] Filed: May 27, 1986

[30] Foreign Application Priority Data

Jun. 12, 1985 [DE] Fed. Rep. of Germany ....... 3520983

[51] Int. Cl.$^4$ .............................. H01Q 1/12; H04B 1/44
[52] U.S. Cl. ..................................... 343/702; 343/795; 343/815; 455/83; 455/78; 455/606
[58] Field of Search ................. 343/700 MS File, 702, 343/745, 747, 795, 801, 802, 815, 827; 455/82, 83, 349, 606, 78

[56] References Cited

U.S. PATENT DOCUMENTS

| 4,344,184 | 8/1982 | Edwards | 343/702 |
| 4,542,532 | 9/1985 | McQuilkin | 455/78 |
| 4,584,709 | 4/1986 | Kneisel et al. | 455/78 |
| 4,590,614 | 5/1986 | Erat | 455/270 |
| 4,631,546 | 12/1986 | Dumas et al. | 343/846 |
| 4,644,366 | 2/1987 | Scholz | 343/702 |

*Primary Examiner*—William L. Sikes
*Assistant Examiner*—Doris J. Johnson
*Attorney, Agent, or Firm*—Frishauf, Holtz, Goodman & Woodward

[57] ABSTRACT

An antenna for a transceiver which does not require a transmit/receive switch, typically a cordless telephone, is formed by a printed circuit board (10) which is subdivided by two separating slits, located in respective separating planes (A, B) into three adjacent regions, defining a first end region (F2) adjacent a first slit, a second end region (F3) adjacent a second slit, and an intermediate or central region (F1) between the slits. Electrical surfaces or conductive tracks are connected across the slits (18, 19) by high-frequency impedance elements, such as high-resistance resistors or chokes, (20, 21). A high-frequency unit is located preferably beneath the intermediate region, and has a transmitter output stage, connected to a first lateral region (F2) forming an antenna, with the intermediate and other end region (F1,F3) forming director and reflector elements; a receiver input of the high-frequency module is connected to the other end region which, then, will form a receiving antenna with the intermediate and first end region forming, respectively, director and reflector elements. The high-frequency connections to the respective antennae are located close to the separating slits.

20 Claims, 2 Drawing Figures

ANTENNA FOR A TRANSCEIVER, PARTICULARLY PORTABLE TELEPHONE

Reference to related application, assigned to the assignee of the present invention, the disclosure of which is hereby incorporated by reference:

U.S. Ser. No. 06/571,078, filed Jan. 16, 1984, Erat, now U.S. Pat. No. 4,590,614.

The present invention is directed to an antenna structure suitable for a combination transmitter-receiver unit, and particularly for a portable telephone.

BACKGROUND

Cordless telephones are well known, see, for example, "Funkschau", 1984, issue 17, page 16, which include a base station and associated hand sets. Each of the hand sets has a rod antenna. The rod antenna, projecting from the respective hand sets, is inconvenient in handling and distracting in appearance, and for storage, particularly on a temporary basis. It is also necessary to provide a transmit/receive (T/R) switch to permit duplex operation. The referenced application Ser. No. 06/571,078, of Jan. 16, 1984, Erat, now U.S. Pat. No. 4,590,614, describes an antenna which defines a dipole structure, formed by conductors located on a printed circuit board which is subdivided into two sections, the conductors on the printed circuit board on the respective sections being interconnected by high-resistance resistors or high-frequency chokes. The regions or zones on the printed circuit board, thus, form the dipole. The conductors or conductive surfaces may carry additional electrical structural components and units, such as integrated circuits, active and passive components, and the like.

THE INVENTION

It is an object to provide an antenna suitable for portable telephone use which has the advantageous characteristics of a rod antenna, for operation both in the transmission as well as in the reception mode, and which does not require additional space in the housing of the telephone or require any parts projecting therefrom.

Briefly, a printed circuit board or plate forming a support surface for electric circuit components has metallic layers applied thereto subdivided by two separating slits, positioned in respective separating planes, to divide the metallic layer or circuit conductive tracks or the like on the board into three adjacent regions. The three regions define a first end region, adjacent a first slit; a second end region adjacent a second slit, and an intermediate region between the slits. High-frequency impedance elements, such as resistors or chokes, are used to connect the first and second respective end regions to the intermediate regions. Some of the electrical circuit components form a transmitter output stage and others a receiver input stage. The transmitter output stage is connected to a first lateral region to form a radiating antenna element, so that, then, the second lateral region and the intermediate region will form, respectively, director and reflector elements for the radiating antenna element. The receiver input stage is coupled to the second end region to form a receiving antenna; the first end region and the intermediate region, then, will form, respectively, director and reflector elements for the receiving antenna. Preferably, the transmitter output stage and the receiver input stage are, respectively, connected to the respective radiating or receiving antenna elements close to the respective separating slits.

The arrangement has the advantage that the entire antenna can be located within the housing of the cordless telephone while having transmission and reception characteristics comparable to those of a projectable rod antenna, both in the transmission as well as in the reception mode. The antenna does not require any additional space, above and beyond that of a printed circuit board which is present anyway, within the telephone housing. An additional advantage is obtained by subdividing the board by two slits into the three regions: a separate T/R switch is unnecessary since the respective transmitting and receiving antenna regions form oppositely located, respectively decoupled, internal antenna units.

In accordance with a preferred feature of the invention, high-frequency modular elements are located above or below the central region of the insulating plate. The high-frequency modules may include a high-frequency transmission element and a high-frequency receiver element, respectively, so constructed that the respective inputs and outputs of the receiver and transmitter can be connected by connecting elements of minimum length to the respective radiating or radiation receiving portions of the antenna elements with minimum length. The structure is particularly applicable for cordless telephones.

DRAWINGS

FIG. 1 is a schematic perspective exploded representation of an antenna in accordance with the present invention in which the exploded views illustrate the current distribution curves arising in the structure of the antenna for, respectively, when a cordless telephone is operated in transmission or receiving mode; and FIG. 2 is a perspective exploded representation of an antenna together with coupling elements for a current source.

DETAILED DESCRIPTION

Figure 1:
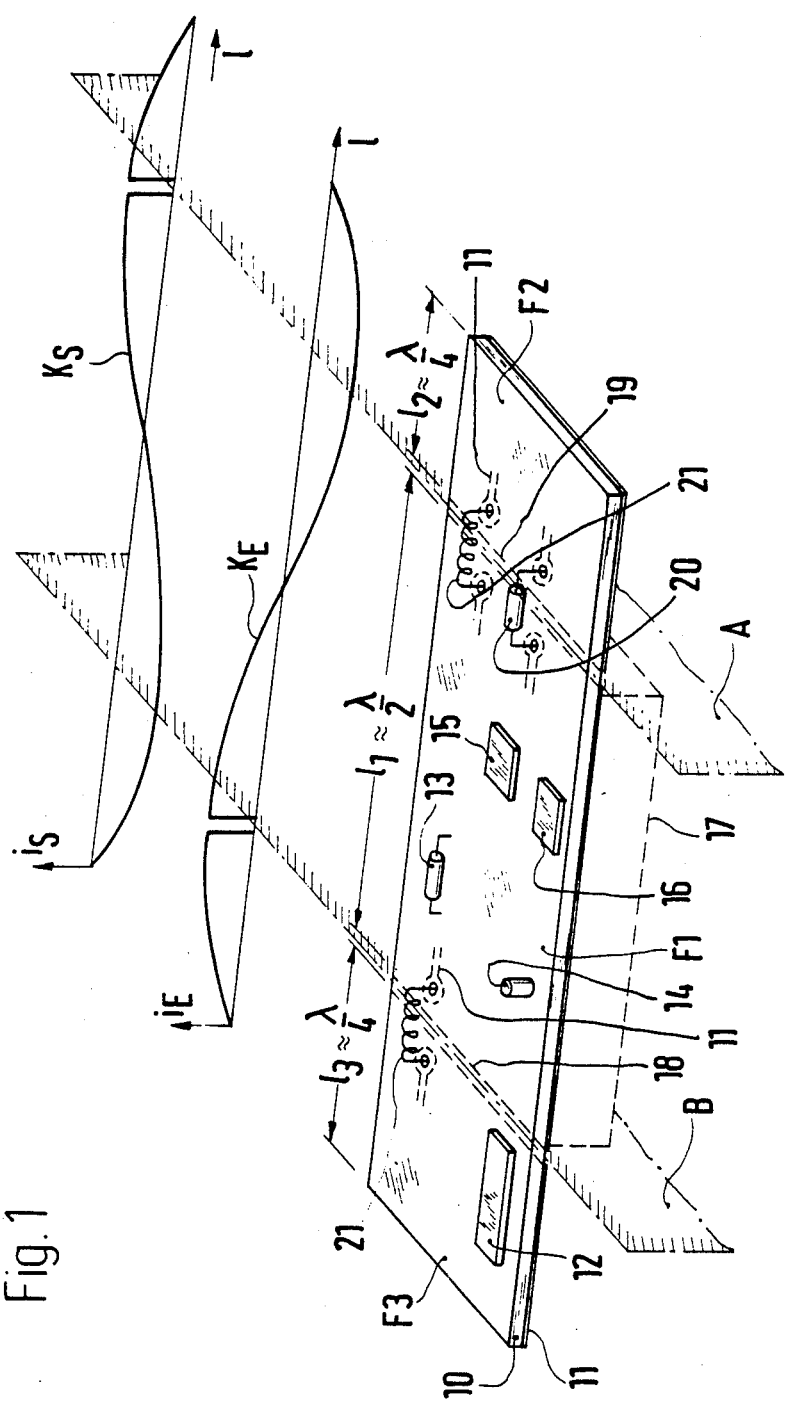

A board or plate of insulating material, preferably coated, plated or otherwise covered with copper, and forming a printed circuit board (PCB) 10, has conductive tracks or surfaces 11 on its bottom side. The upper side of the PCB board 10 carries electrical and electronic elements 12, 13, 14, 15, 16, shown only schematically, and of any suitable and standard construction as required by the circuitry of a cordless telephone. Electrical circuit elements and components can also be located on the bottom side of the PCB 10, if required; FIG. 1 shows, for illustration, one such element 17. Electrically conductive tracks or surfaces may also be applied to the top side of the PCB 10.

In accordance with a feature of the invention, the PCB 10 is subdivided by two separating planes A, B into a central region or zone F1 and two lateral regions or zones F2, F3. The electrically conductive tracks or surfaces 11 are all separated from each other in the region of the separating planes A, B by slits 18, 19. The electrical or electronic components or elements may reach up to the outer limit of the slits, see, for example, element 12. The electrical connection of conductive regions or tracks between the respective end regions F2, F3 and the central or intermediate region F1, is effected by high-resistance resistors 20, or high-frequency chokes 21. The respective regions F1 and F2, F3, thus, are decoupled from each other with respect to high frequency.

A reception antenna is formed by the lateral region F3, forming a radiation reception element. Counter elements are then formed by the regions F1 and F2, as director and reflector elements, defined by the electrically conductive materials, components or circuits or surfaces on the respective regions F1, F2. In analogous manner, the transmission antenna is formed by all the metallic components of the lateral region F2, thereby defining a transmission radiating element. The conductive component portions, tracks or surfaces in the regions F1, F3 then form counter elements, for example a director and a reflector.

In accordance with a feature of the invention, the lengths of the regions F1, F2, F3 is selected with respect to the median wave lengths with which the telephone is to operate, as follows: The length $l_1$ of the intermediate or central region F1 is preferably about $\lambda/2$; the lengths $l_2$, $l_3$ of the end regions F2, F3 are approximately $\lambda/4$, wherein $\lambda$, of course, is the median wave length.

The current distribution curve $K_e$ is shown in FIG. 1 for the reception mode of operation, illustrated to be above the insulating plate 10. The current distribution curve shows the dependence of current $i_E$ based on length of the antenna 1. The current distribution curve for transmission operation is shown by curve $K_S$, which shows the current $i_S$.

Figure 2:
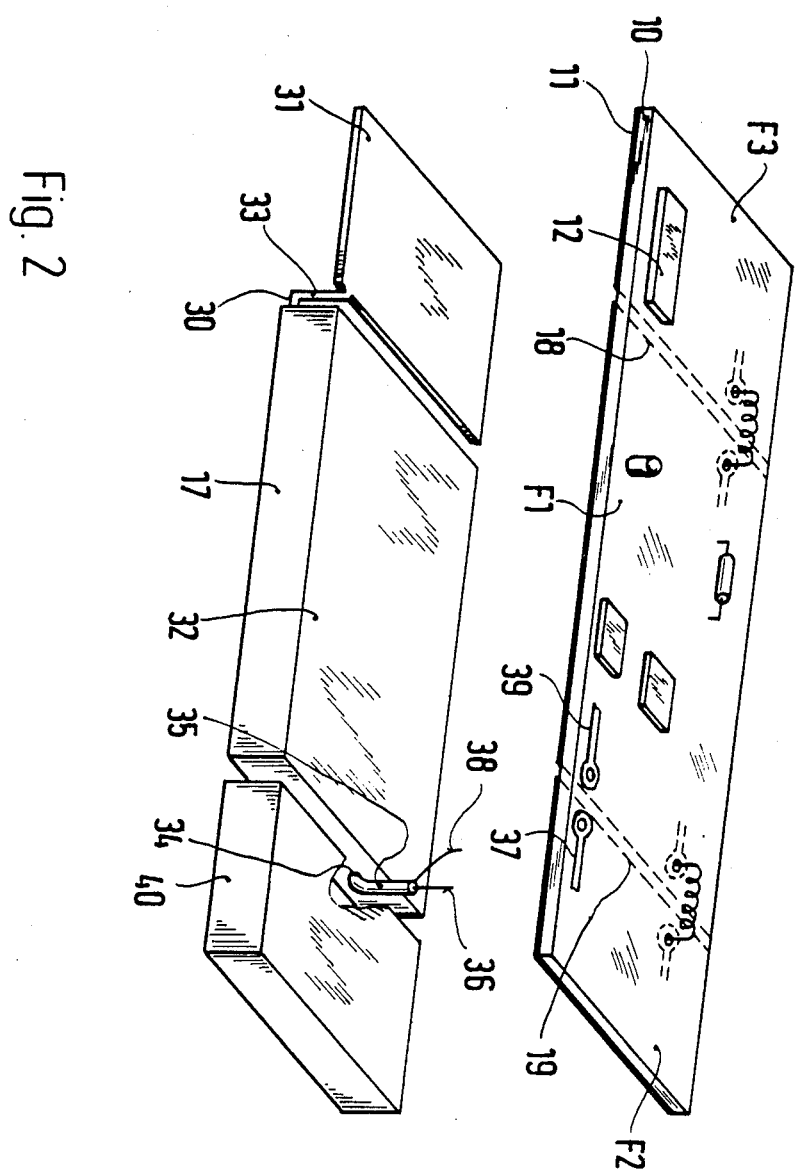

The respective antenna regions, for transmission or reception, are coupled to excitation elements, or receiver input stages, preferably close to the respective slits 18, 19. FIG. 2 illustrates suitable arrangements. The component 17—see FIG. 1—which, for example, includes a high-frequency unit, has a transmission and a receiving portion. An antenna terminal 30 is connected to a capacitative coupling element 31 which, preferably, is a copper coating or copper layer on an insulating foil. The plane of the coupling element 31 is roughly in the plane of the upper wall 32 of the element 17. The element 17, for example located within a shielded housing, is placed on the bottom side of the PCB 10, preferably on an interposed insulating surface to separate the element 17 from conductive tracks and surfaces 11 on the PCB 10. The high-frequency module or unit 17 may be mechanically connected with the PCB 10. If so, the coupling element 31 is located with but a slight distance beneath the PCB 10, thereby forming a capacitor, over which signals of the antenna F3, with director and reflector F1, F2, can be coupled to the unit 17. If the terminal 30 is the input terminal to the receiver portion of the high-frequency module 17, the region F3 will form the receiving antenna through which received signals by the antenna F3, with counter elements F1, F2, can be coupled out and transmitted to the module 17. The capacitive coupling element 31 and the connection element 33 must have predetermined geometric dimensions to obtain optimum coupling. The dimensions can be readily determined by standard antenna design engineering, based on the frequency ranges with which the antenna is to be used.

Transmitted energy is coupled from a transmitter terminal 34, at the side opposite the receiver terminal 30 from the module 17. The coupling may be as shown in connection with the capacitative coupling 31 but, for example, may also be different. FIG. 2 illustrates a galvanic connection of the transmitter energy coupled from the high-frequency module 17 by means of a coaxial cable 35. The inner or center conductor 36 of the coaxial cable 35 is coupled with the conductive track 37 on the lateral region F2; the outer or jacket conductor 38 is connected to a conductive track 39 of the central region F1. FIG. 2 also illustrates the placement of a current supply source 40, located adjacent the high-frequency module 17, but spaced therefrom by some distance, and located beneath the region F2 of the PCB 10. The current source 40 may, for example, by a rechargeable battery or the like which, of course, will include conductive elements. These conductive elements will contribute to form the transmission antenna F2, with its counter weights F1, F3. The current source 40 can be used to supply electrical energy not only to the high-frequency module 17, but also to further electrical and electronic components.

Preferably, the PCB, with all components and elements assembled and connected thereto, is located in a housing made of insulating material and of high radiation transmissivity to decrease damping due to the housing. The housing itself has been omitted from the drawings for clarity since it may be of any suitable and standard construction.

Various changes and modifications may be made within the scope of the inventive concept.

In a cordless telephone, designed for operation at 900 MHz, a PCB 10 having a length $l_1+l_2+l_3$ of about 220 mm length, and a width of about 60 mm is suitable. The thickness of the plate, for example, may be 1.5 mm. The length $l_1$ is: 110 mm The length $l_2$ and $l_3$, respectively, is: 52 mm The width of the slits 18, 19 is in the order of about 3 mm. A suitable resistance value for a decoupling resistor 20 is: 10 kilo ohms.

I claim:

1. Antenna for a transceiver having
   a board of insulating material (10);
   a metallic layer, subdivided to form electrically conductive tracks and surfaces (11), applied to said board,
   said board forming a support surface for electrical circuit components (12-17),
   wherein, in accordance with the invention,
   the metallic layer (11) is formed with two separating slits (18,19) positioned in respective separating planes (A,B), subdividing the metallic layer into three adjacent regions (F3, F2, F1), defining a first end region (F2) adjacent a first slit (18), a second end region (F3) adjacent a second slit (19) and an intermediate region (F1) between said slits;
   high-frequency impedance elements (20,21) are provided, each connecting a respective one of said first and second end regions (F2, F3) to the intermediate region (F1);
   a transmitter output stage being connected to a first end region (F2) to form a radiating antenna element, a second end region and an intermediate region respectively forming director and reflector elements (F3, F1) for said radiating antenna element,
   wherein a receiver input stage is coupled to the second end region (F3), to form a receiving antenna, the first end region and the intermediate region (F2, F1) respectively forming director and reflector elements for the receiving antenna; and
   said transmitter output stage and said receiver input stage, respectively, are each connected to the respective antenna element, close to the respective separating slit, by a minimum-length connector (30,35) bridging said slit.

2. Antenna according to claim 1, wherein said regions form aligned conductive plate-like zones, and said separating slits are essentially parallel.

3. Antenna according to claim 1, wherein said regions are longitudinally aligned to form, essentially, an elongated rectangle, said separating slits extending transversely of said rectangle between two sides thereof.

4. Antenna according to claim 3, wherein said separating slits extend between the longer sides of the rectangle.

5. Antenna according to claim 1, wherein said electrical circuit components include a high-frequency modular element (17), said modular element comprising said transmitter output stage and said receiver input stage;

and wherein the transmitter output stage has a terminal located immediately adjacent the separating plane defining the slit (19) between the first (F2) lateral region, and the intermediate region (F1); and the receiver input stage is positioned on said module immediately adjacent the slit (18) separating the second end region (F3) from the intermediate region (F1).

6. Antenna according to claim 5, wherein the high-frequency module is located on a respective side, of the board of insulating material, opposite the conductive material, in the zone of the intermediate region (F1).

7. Antenna according to claim 5, wherein a capacitive coupling element (31) is provided for coupling the high-frequency module (17) to at least one of said antenna elements.

8. Antenna according to claim 7, wherein the capacitative coupling element comprises an insulating foil with a conductive surface, capacitatively coupled to the respective end region forming the respective antenna element.

9. Antenna according to claim 5, wherein a galvanic coupling element (35) is provided, connected to said high-frequency module and to at least one of said antenna elements for coupling the module to the respective antenna element.

10. Antenna according to claim 9, wherein the galvanic coupling element comprises a coaxial cable (35).

11. Antenna according to claim 10, wherein the coaxial cable has its center conductor connected to the respective end region forming the antenna element and the outer conductor connected to the intermediate region (F1).

12. Antenna according to claim 1, wherein each high-frequency impedance element comprises a high-resistance resistor (20).

13. Antenna according to claim 1, wherein each high-frequency impedance element comprises a high-frequency choke (21).

14. Antenna according to claim 1, wherein the insulating plate (10) is essentially rectangular, the intermediate region (F1) has a length $l_1$ of approximately $\lambda/2$;

the end regions (F2, F3) each have a length of, respectively, $l_2$ and $l_3$ of approximately $\lambda/4$, wherein $\lambda$ defines the average operating wave length of radiation being transduced by said antenna element.

15. The combination of a transmitter-receiver module (17) and a printed circuit board (10) of insulating material, a metal layer, subdivided to form electrically conductive tracks and surfaces (11), applied to said board, with a transmitter-receiver antenna, wherein said transmitter-receiver antenna comprises a metallic layer on said board (10), said metallic layer being formed with two separating slits (18, 19) positioned in respective separating planes (A,B) to subdivide the metallic layer into three regions comprising first and second end regions (F2, F3), at lateral sides of the board, and an intermediate region (F1) between said first and second end regions;

said module (17) including a transmitter output stage and a receiver input stage, said transmitter output stage being coupled to one (F2) of said end regions immediately adjacent the slit (19) separating said one end region from the intermediate region (F1) and the receiver input stage being coupled to the other end region (F3) immediately adjacent said slit (18) separating said other end region (F3) from the intermediate region (F1);

wherein said module is located on said printed circuit board, insulated from said intermediate region and located within the geometrical outline of said intermediate region; and high-frequency impedance elements (20, 21) are provided, each coupling a respective one of the respective end regions (F2, F3) to the intermediate region (F1) and electrically bridging a respective one of the slits.

16. Combination according to claim 15, wherein said high-frequency impedance elements comprise at least one of:

a high-resistance resistor (20);

a high-frequency choke (21).

17. Combination according to claim 15, further including a capacitative coupling element (31) connected to the module (17) and capacitatively coupling the module to a respective end region (F3).

18. Combination according to claim 17, wherein the capacitative coupling element comprises a foil element, insulated from and capacitatively coupled to the respective end region.

19. Combination according to claim 15, further including a galvanic coupling element (35) connecting the high-frequency module to an end region (F2).

20. Combination according to claim 19, wherein the galvanic coupling element comprises a coaxial cable having its center conductor connected to one of the end regions immediately adjacent the respective slit (18, 19) and its outer or sleeve conductor connected to the intermediate region.

* * * * *